United States Patent
Fusella et al.

(10) Patent No.: US 11,217,762 B2
(45) Date of Patent: Jan. 4, 2022

(54) SURFACE-PLASMON-PUMPED LIGHT EMITTING DEVICES

(71) Applicant: Universal Display Corporation, Ewing, NJ (US)

(72) Inventors: Michael Fusella, Lawrenceville, NJ (US); Nicholas J. Thompson, New Hope, PA (US); Eric A. Margulies, Philadelphia, PA (US)

(73) Assignee: Universal Display Corporation, Ewing, NJ (US)

(*) Notice: Subject to any disclaimer, the term of this patent is extended or adjusted under 35 U.S.C. 154(b) by 108 days.

(21) Appl. No.: 16/688,225

(22) Filed: Nov. 19, 2019

(65) Prior Publication Data
US 2020/0176700 A1  Jun. 4, 2020

Related U.S. Application Data

(60) Provisional application No. 62/773,299, filed on Nov. 30, 2018, provisional application No. 62/817,334, filed on Mar. 12, 2019.

(51) Int. Cl.
| H01L 51/50 | (2006.01) |
| H01L 51/52 | (2006.01) |
| H01L 51/56 | (2006.01) |

(52) U.S. Cl.
CPC ........ *H01L 51/5008* (2013.01); *H01L 51/504* (2013.01); *H01L 51/5203* (2013.01); *H01L 51/5262* (2013.01)

(58) Field of Classification Search
CPC ............... H01L 51/5008; H01L 51/504; H01L 51/5203; H01L 51/5012; H01L 51/5262; H01L 51/5265; Y10S 977/774; Y10S 977/812
See application file for complete search history.

(56) References Cited

U.S. PATENT DOCUMENTS

| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Mary A Wilczewski
(74) *Attorney, Agent, or Firm* — Butzel Long

(57) ABSTRACT

Devices and techniques are provided for achieving OLED devices that include one or more plasmonic material exhibiting surface plasmon resonance and one or more outcoupling layers.

17 Claims, 4 Drawing Sheets

(56) References Cited

U.S. PATENT DOCUMENTS

| | | |
|---|---|---|
| 6,303,238 B1 | 10/2001 | Thompson |
| 6,337,102 B1 | 1/2002 | Forrest |
| 6,468,819 B1 | 10/2002 | Kim |
| 7,279,704 B2* | 10/2007 | Walters .................. C09K 11/06 257/40 |
| 7,431,968 B1 | 10/2008 | Shtein |
| 7,968,146 B2 | 6/2011 | Wagner |
| 8,368,998 B2* | 2/2013 | Tang ..................... G02F 1/1334 359/296 |
| 9,114,981 B2* | 8/2015 | An ........................ H01L 51/504 |
| 9,634,277 B2* | 4/2017 | Zou ....................... H01L 51/504 |
| 9,960,386 B2* | 5/2018 | Thompson .......... H01L 51/5203 |
| 10,403,854 B2* | 9/2019 | Thompson .......... H01L 51/5203 |
| 11,056,540 B2* | 7/2021 | Thompson .......... H01L 27/3209 |
| 2003/0230980 A1 | 12/2003 | Forrest |
| 2004/0174116 A1 | 9/2004 | Lu |
| 2012/0229891 A1* | 9/2012 | Liu ...................... G01N 21/648 359/355 |
| 2014/0151678 A1* | 6/2014 | Sakuma ............. H01L 51/5271 257/40 |
| 2015/0162560 A1* | 6/2015 | Chen .................. H01L 51/5221 257/40 |
| 2017/0058310 A1* | 3/2017 | Casasanta, III ...... G01N 21/553 |
| 2017/0133631 A1* | 5/2017 | Thompson .......... H01L 51/5044 |
| 2017/0229663 A1 | 8/2017 | Tsai |
| 2018/0219182 A1* | 8/2018 | Thompson .......... H01L 51/5234 |
| 2019/0348636 A1* | 11/2019 | Thompson .......... H01L 51/5234 |
| 2020/0127212 A1* | 4/2020 | Adamovich ........ H01L 51/0067 |
| 2020/0176700 A1* | 6/2020 | Fusella ............... H01L 51/5262 |
| 2020/0176714 A1* | 6/2020 | Fusella ............... H01L 51/5262 |
| 2020/0295093 A1* | 9/2020 | Thompson .......... H01L 27/3209 |
| 2021/0249633 A1* | 8/2021 | Fusella ............... H01L 51/5016 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Krishnamoorthy, et al., Topological Transitions in Metamaterials, Science 336, 205 (2012), DOI 10.1126/science. 1219171, downloaded from www.sciencemag.org on Jul. 17, 2014.

An et al., "Surface plasmon mediated energy transfer of electrically-pumped excitons", Mar. 1, 2010, vol. 18, No. 5, Optics Express 4041.

Jin et al., "Optimization of period and thickness of the corrugated Ag cathodefor efficient cross coupling between SPP and microactivity modesin top-emitting OLEDs", vol. 7, No. 6, Jun. 1, 2017, Optical Materials Express 2096.

Galfsky et al., "Directional emission from quantum dots in a hyperbolic metamaterial", Cleo 2014.

* cited by examiner

SURFACE-PLASMON-PUMPED LIGHT EMITTING DEVICES

CROSS-REFERENCE TO RELATED APPLICATIONS

This application is a non-provisional of U.S. Provisional Patent Application Ser. No. 62/773,299, filed Nov. 30, 2018, and U.S. Provisional Patent No. 62/817,334, filed Mar. 12, 2019, the entire contents of each of which are incorporated herein by reference.

FIELD

The present invention relates to light-emitting devices including plasmonically active layers and outcoupling layers, and related structures for use in organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, an organic emissive device is provided that includes a substrate; a first electrode disposed over the substrate; an emissive stack disposed over the first electrode, the emissive stack comprising a first organic emissive material; a second electrode disposed over the emissive stack; a first enhancement layer comprising a plasmonic material exhibiting surface plasmon resonance that non-radiatively couples to an organic emissive material in the organic emissive layer and transfers excited state energy from the organic emissive material to a non-radiative mode of surface plasmon polaritons of the enhancement layer; and an emissive outcoupling layer disposed over the substrate and comprising a second emissive material; wherein the device is configured to transfer energy from the non-radiative mode of surface plasmon polaritons of the enhancement layer to the second emissive material.

The first enhancement layer may include the first electrode or the second electrode, and/or an adhesion layer. The device may include a second enhancement layer, which also may include an adhesion layer and/or one of the electrodes. More generally, either of the enhancement layers may include either of the electrodes. The device may include a spacer layer, for example a dielectric material, which may be disposed between the first electrode and the emissive outcoupling layer or between the second electrode and the emissive outcoupling layer. The emissive outcoupling layer may be disposed at least 1 nm from the first electrode, not more than 100 nm from the first electrode, at least 1 nm from the second electrode, and/or not more than 100 nm from the second electrode. Any or all of the first electrode, the second electrode, the first enhancement layer, and the second enhancement layer may include Au, Ag, Mg, Al, Ir, Pt, Ni, Cu, W, Ta, Fe, Cr, Ga, Rh, Ti, Cr, Ru, Pd, In, Bi, a small organic molecule, a polymer, SiO2, TiO2, Al2O3, an insulating nitride, Si, Ge, and stacks or alloys of these materials. The second emissive material may include a quantum dot, perovskite nanocrystals, a metal-organic framework, a covalent-organic framework, a thermally activated delayed fluorescence (TADF) emitter, a fluorescent emitter, and/or a phosphorescent organic emitter. The second emissive material comprises a material having a Stokes shift of not more than 20 nm, not more than 10 nm, or not more than 5 nm. The second emissive material may include a down-converting material that converts a high-energy excitation state to a lower-energy wavelength emission. The second emissive material may include a molecule that changes the orientation of one or more transition dipole moments (TDMs) upon excitation of the molecule. The second emissive material may include a triplet-emitting emissive material having non-parallel transition dipole moments (TDMs) for an absorptive singlet state and an emissive triplet state. The angle between the TDMs of the absorptive singlet state and the emissive triplet state may be 30-63 degrees. The second emissive material may be arranged so that the singlet TDM is non-parallel to the second electrode. The angle between the singlet TDM and the second electrode may be 30-63 degrees. The second emissive material may be arranged so that the triplet TDM is non-perpendicular to the second electrode. The angle between the triplet TDM and the second electrode my be 37-60 degrees. The second emissive material may include a fluorophore having a lowest-energy singlet TDM that is non-parallel to one or more higher-energy singlet TDMs within the same fluorophore. The angle between the lowest-energy singlet TDM and at least one higher-energy singlet TDM may be 30-63 degrees. The second emissive material may be arranged so that the one or more higher-energy singlet TDMs are non-perpendicular to the second electrode. The angle between at least one higher-energy singlet TDM and the second electrode may be 37-60 degrees. The second emissive material may include a multi-emitter cascade. The concentration of the second emissive material may vary within the emissive outcoupling layer. For example, the concentration may be graded in proportion to a distance from an interface of the emissive outcoupling layer. The device may include a second emissive outcoupling layer, including a third emissive material, adjacent to the first emissive outcoupling layer. The first emissive outcoupling layer may be disposed between the first electrode and the substrate. In addition, the device may include second emissive outcoupling layer disposed over the second electrode that includes a third emissive material. The third emissive material comprises a material selected from the group consisting of: a quantum dot, perovskite nanocrystals, metal-organic frameworks, covalent-organic frameworks, a thermally activated delayed fluorescence (TADF) emitter, a fluorescent emitter, or a phosphorescent organic emitter. The third emissive material may have a Stokes shift of not more than 20 mm, not more than 10 nm, or not more than 5 nm. The third emissive material may include a down-converting material that converts a high-energy excitation state to a lower-energy wavelength emission.

According to an embodiment, an OLED display is provided in which a plurality of individually-addressable OLED pixels are disposed over a substrate. Each of the pixels may include a first electrode disposed over the substrate; an emissive stack disposed over the first electrode, the emissive stack comprising a first organic emissive material; and a second electrode disposed over the emissive stack; wherein each OLED pixel comprises the same first organic emissive material, and each OLED pixel further comprises a first emissive outcoupling layer disposed over the second electrode or between the first electrode and the substrate, the first emissive outcoupling layer comprising a second emissive material that differs between at least two of the plurality of pixels; and wherein, within each OLED pixel, either the first electrode or the second electrode is disposed between the emissive stack and the emissive outcoupling layer and non-radiatively transfers energy from the first organic emissive material to emissive outcoupling layer. Each OLED pixel may emit a color determined by the second emissive material. Within each OLED pixel, the emissive stack may contains a single emissive layer.

BRIEF DESCRIPTION OF THE DRAWINGS

FIG. 3A includes a bottom emissive outcoupling layer, which contains an emissive material; FIG. 3B includes a top emissive outcoupling layer, which contains an emissive material; and FIG. 3C includes both top and bottom emissive outcoupling layers, each of which contain an emissive material.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
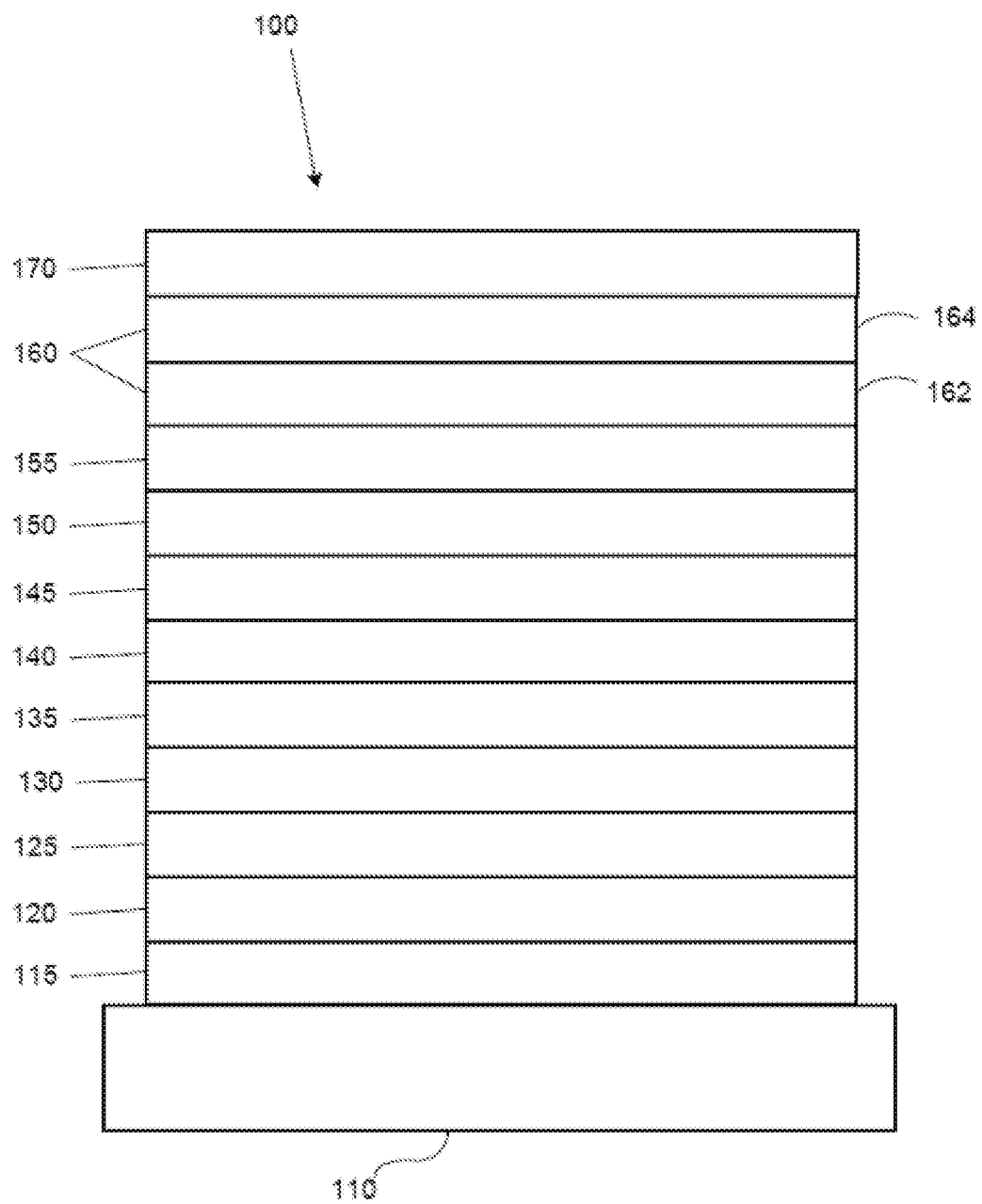
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
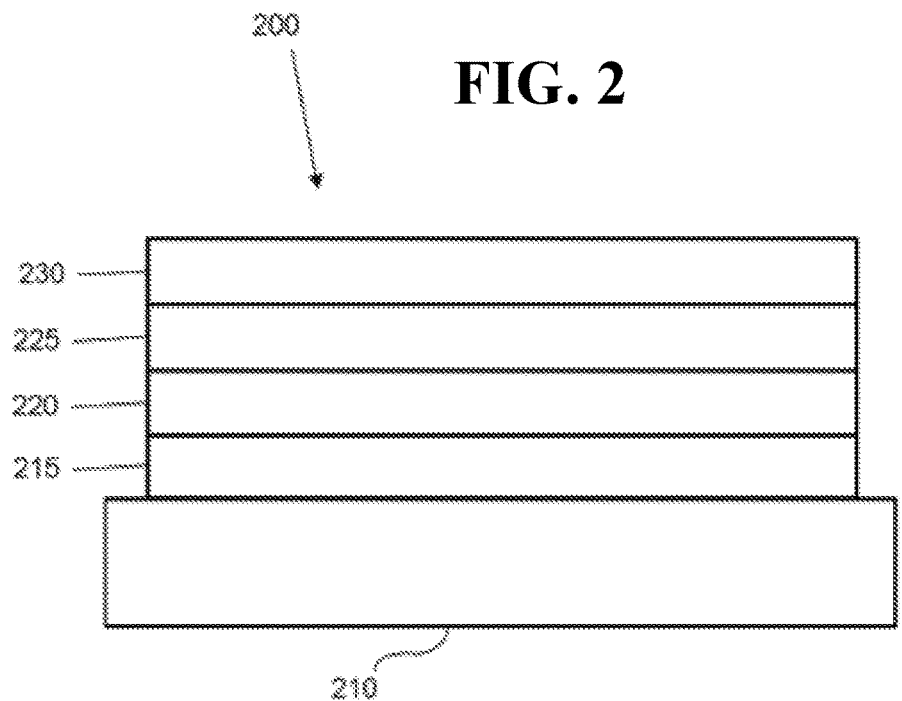
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

It has been found that, in contrast to conventional teachings that attempt to prevent or inhibit exciton energy transfer to non-radiative modes of surface plasmon polaritons (SPPs) in metal electrodes, it may be beneficial to transfer as much energy as possible to these non-radiative modes and then extract the energy to free space as emitted light through the use of outcoupling layers. This is contrary to conventional understandings in the art because such energy typically is lost in conventional device structures. Specifically, in organic light emitting diode (OLED) devices, placing the emissive layer (EML) within a threshold distance of the metal electrodes will couple the excited state energy of the electrically-excited excitons into the surface plasmon resonant (SPR) mode of an enhancement layer, which may be or include the metal electrode. Conventionally, such an arrangement is considered to be an energy loss pathway and therefore undesirable. However, embodiments disclosed herein make use of this energy pathway to increase device lifetime by decreasing the time that an exciton resides on the emitter molecule.

It has been found that methods and arrangements that outcouple energy in the form of light from the SPR mode may be beneficial in obtaining OLEDs that have longer lifetimes at display luminance levels.

Examples of devices, outcoupling layers, enhancement layers, and device structures that make use of this effect are provided in U.S. Pat. No. 9,960,386, the disclosure of which is incorporated by reference in its entirety.

It has been found that further benefits may be achieved by incorporating an emissive layer over an electrode, which also may be an enhancement layer as disclosed herein, which is pumped by surface plasmon energy originating from the quenching of excitons from an emitter in an OLED stack into the metal contact electrode/enhancement layer.

Figure 3A:
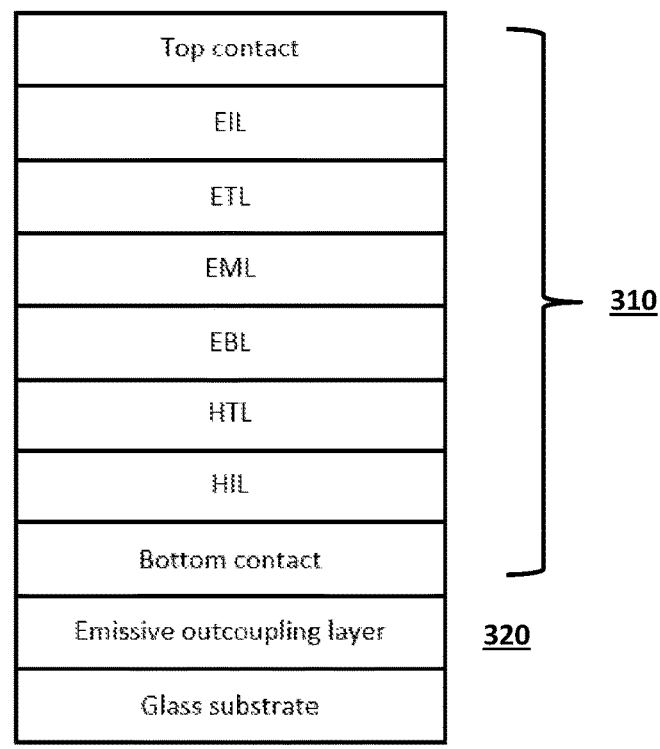
FIGS. 3A-3C show example device structures according to embodiments disclosed herein. Each device includes an emissive OLED stack, a top and bottom electrode contact, and at least one emissive outcoupling layer.
Figure 3B:
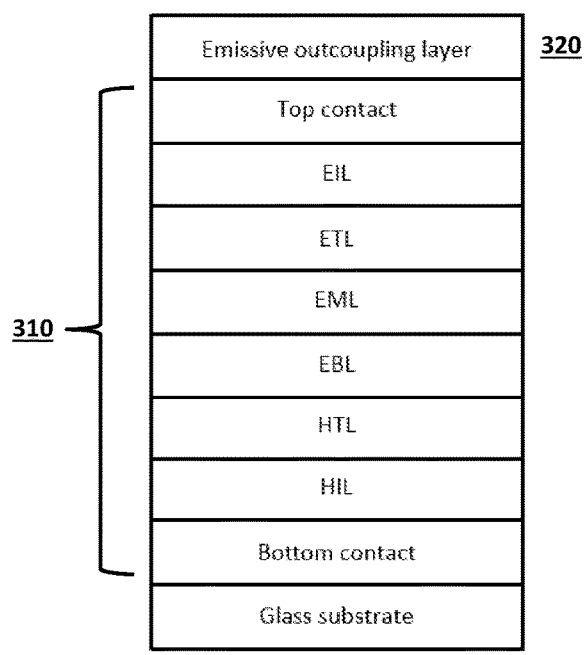
Figure 3C:
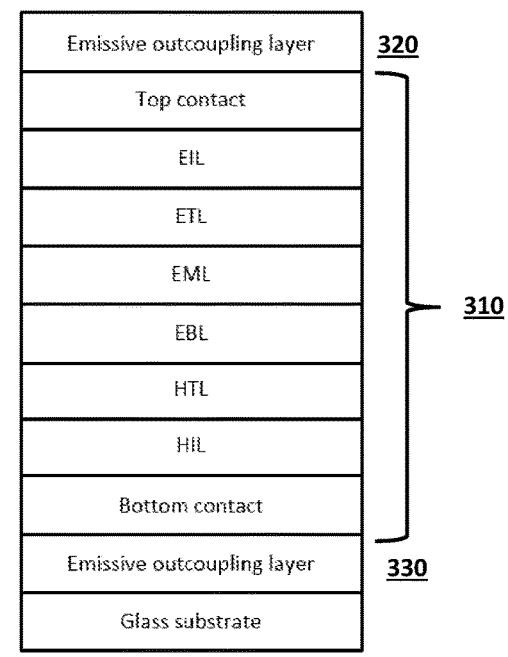

FIGS. 3A-3C show example device configurations according to embodiments disclosed herein. In each example, the emissive stack 310 may include any or all of the various layers and structures previously disclosed with respect to FIGS. 1-2, including hole and electron injection layers (HILs/EILs), hole and electron transport layers (HTLs/ETLs), emissive layers (EMLs), and top and bottom electrodes (also referred to as "contacts"). The electrodes may be or include enhancement layers as disclosed herein, or an enhancement layer as disclosed herein may include an electrode. As used herein, an enhancement layer refers to a layer that includes a plasmonic material that can exhibit surface plasmon resonance that non-radiatively couples to an organic emissive material and transfers excited state energy from the organic emissive material to a non-radiative mode of surface plasmon polaritons (SPPs) of the enhancement layer. Unless otherwise specified, a metal contact, anode, cathode, or electrode as disclosed herein may function as, provide, or be included in an enhancement layer. An enhancement layer may include multiple electrode layers which may be the same or different materials. It also may include other layers, such as an adhesion layer.

Each device also includes one or more emissive outcoupling layers 310, 320, which may be disposed between a substrate and a lower electrode (FIG. 3A), above an upper electrode (FIG. 3B), or both (FIG. 3C). In general, an enhancement layer as disclosed herein may be in relatively close proximity to an emissive outcoupling layer. For example, in FIG. 3A, the bottom electrode of the emissive stack 310 may be in relatively close proximity to the emissive outcoupling layer 320, such as in direct contact or separated by a single layer such as a spacer layer. In this arrangement, the bottom electrode may function as an enhancement layer as disclosed herein because it is expected that it will exhibit surface plasmon resonance that non-radiatively couples to an emissive material in the EML of the emissive stack and transfers excited state energy from the emissive material to SPPs of the bottom electrode. The top electrode of the emissive stack 310 may be a conventional electrode, or it also may be an enhancement layer. Similarly, the top electrode of the emissive stack 310 in FIG. 3B may be an enhancement layer as disclosed herein, while the bottom electrode may be a conventional electrode or an enhancement layer. In FIG. 3C, each of the top and bottom electrodes may be an enhancement layer as disclosed herein.

An emissive outcoupling layer as disclosed herein may be distinguished from conventional outcoupling layers such as microlenses, outcoupling grids, diffraction gratings, and the like in that an emissive outcoupling layer does not merely outcouple light from, for example, a substrate mode to an air mode. Rather, an emissive outcoupling layer as disclosed herein includes one or more emissive materials that can be excited by energy transferred to the emissive outcoupling layer and then emitted as light. In fact, devices and structures disclosed herein may use both an emissive outcoupling layer as disclosed herein as well as one or more conventional outcoupling structures, features, or layers.

For example, as disclosed in further detail herein, the emissive material may be excited by energy transferred from surface plasmon polaritons in a nearby electrode, which energy then may be emitted as light. As such, an emissive outcoupling layer as disclosed herein may be understood as a plasmon-pumped emissive layer. The proximity of this layer to the electrode means that energy from the excited molecule can be back-coupled into the metal contact of the electrode and therefore represents a significant loss pathway. If the emissive outcoupling layer is farther away from the metal contact, it will less efficiently couple to the surface plasmon mode used to excite the emissive outcoupling layer and efficiency will be reduced. Accordingly, it may be preferred for the emissive outcoupling layer to be close to the metal contact to increase near-field coupling to the surface plasmon mode in the metal, but include additional features or arrangements that reduce the back-coupling energy loss pathway. The present disclosure provides such techniques to achieve strong coupling to the plasmon mode for pumping the emissive outcoupling layer, while simultaneously reducing the back-coupling loss pathway.

To enhance the stability of the emitter in the OLED stack, the exciton energy may be rapidly quenched into a metal contact such as an electrode or an enhancement layer containing the electrode or other metal contact. Such techniques are disclosed in further detail in U.S. Pat. No. 9,960,386, the disclosure of which is incorporated by reference in its entirety. This quenching generates surface plasmon modes that can couple to the opposite side of the metal contact and near-field couple to an emissive outcoupling layer as disclosed herein. As previously disclosed, an emissive outcoupling layer contains one or more emissive materials that can be excited by the energy of the surface plasmon polaritons in the nearby contact. Examples of suitable emissive material for an emissive outcoupling layer as disclosed herein include quantum dots, fluorescent emitters, phosphorescent organic emitters, perovskite nanocrystals, metal-organic frameworks, covalent-organic frameworks, and thermally activated delayed fluorescence (TADF) emitters. In embodiments that use multiple emissive outcoupling layers, the emissive material in each layer may be the same as or different than the emissive material in the other layer, and each material may include any of the properties or combinations of materials as disclosed herein.

In an embodiment, the concentration of emissive material within an emissive outcoupling layer may not be uniform throughout the emissive outcoupling layer. For example, the concentration of emissive material may be graded proportionally to the distance within the emissive outcoupling layer from an interface of the emissive outcoupling layer with an adjacent layer, i.e., the concentration may be higher or lower at increasing distances from a boundary of the emissive outcoupling layer.

In an embodiment, it may be preferred for the emissive layer and one or more enhancement layers to be within a "threshold distance" of one another, which corresponds to the distance at which the total non-radiative decay rate constant is equal to the total radiative decay rate constant. In some embodiments disclosed herein, it may be preferred for the emissive layer to be disposed within the threshold distance of one or both enhancement layers in the device. For example, the emissive layer may be disposed within the threshold distance of each of the anode and the cathode, where the two electrodes are configured to be enhancement layers as disclosed herein. The threshold distance may be understood and defined for a given pair of light emitting material and enhancement layer. For any such pair, there is a total nonradiative decay rate constant and a total radiative decay rate constant. As the light emitting material layer approaches the enhancement layer, the non-radiative decay rate constant increases differently than the radiative decay rate constant. At some distance, for the first time the total nonradiative decay rate constant of the light emitting material in the presence of the enhancement layer is equal to the total radiative decay rate constant of the light emitting material in the presence of the enhancement layer. This distance may be defined as the threshold distance. For distances closer to the enhancement layer than this distance, the total non-radiative decay rate is larger than the radiative decay rate and the quantum yield is less than 0.5 or 50%. For distances larger than the threshold distance, the total radiative decay rate constant is larger than the total non-radiative decay rate constant; however, the quantum yield of the light emitting material is reduced compared to the case when the enhancement layer is not present. Light emission is still quenched; however, this quenching can still benefit the device when the outcoupling layer is introduced as it will be recovered as light. Further, the speed up of emission due to the increased rate constants can increase the operational stability of the device.

The physical values of the threshold distance disclosed herein depends on a number of factors including the frequency of the surface plasmon polariton, oscillator strength of the light emitting material, the orientation of the transition dipole moment of the light emitting material, and the dielectric constant of the light emitting material layer. Therefore, by selecting a suitable set of materials for the organic light emitting material and the plasmonic material of the enhancement layer, the threshold distance can be adjusted.

The threshold distances at which the total nonradiative decay rate constant of the light emitting material in the presence of the enhancement layer is equal to the total radiative decay rate constant of the light emitting material in the presence of the enhancement layer and related calculations are discussed in further detail in U.S. Pat. No. 9,960,386, the disclosure of which is incorporated by reference in its entirety.

In an embodiment, it may be advantageous for the emissive material in an emissive outcoupling layer as disclosed herein to have absorption and emission spectra demonstrating a small Stokes shift, such that only a small red-shift occurs between the OLED exciton energy that is quenched into an enhancement layer and the emitted light from the emissive outcoupling layer or layers. This may preserve the emission color of the device. As a specific example, an emissive material in an emissive outcoupling layer as disclosed herein may have a Stokes shift of not more than 20 nm, not more than 10 nm, not more than 5 nm, or any intervening value. Generally, a smaller Stokes shift is more preferred. However, in some arrangements an especially small Stokes shift may have an undesirable impact on other properties of the emissive outcoupling layer or the device while achieving little additional benefit over a slightly larger Stokes shift, in which case it may be desirable to have a slightly larger Stokes shift within the ranges disclosed herein.

In an embodiment, the emissive material may be chosen to down-convert a higher-energy excitation to a lower-energy wavelength (e.g., converting blue emission to green or red). This may enable a single OLED structure to be utilized in every pixel of a display, with the color chosen by the emissive outcoupling layer. For example, this may be achieved by depositing different-sized quantum dots in the outcoupling layer(s) of different pixels to tune the emission wavelength.

In an embodiment, molecular engineering can be used to minimize loss of energy due to coupling of the plasmon-pumped molecule's energy back into the surface plasmon mode of the nearby contact (back-coupling). For triplet-emitting emissive materials, the molecule may be designed to have orthogonal transition dipole moments (TDM) for the absorptive singlet and emissive triplet states. It may be preferred for the singlet TDM to be perpendicular to the contact to maximize coupling of this TDM to the plasmon mode, and the triplet TDM to be parallel to the contact to minimize back-coupling of the emitter energy back into the surface plasmon mode of the contact. As another example, for a fluorophore (non-triplet-emitting) emissive material, the molecule may be designed to have orthogonal TDMs for the lowest-energy (S1) and higher-energy (S2, S3, etc.) singlet states. It may be preferred for the higher-energy (ex. S2) singlet state TDM to be perpendicular to the contact to maximize coupling of this TDM to the plasmon mode, and the lowest-energy (S1) singlet TDM to be parallel to the contact to minimize back-coupling of the emitter energy back into the surface plasmon mode of the contact.

In an embodiment, a molecule may be designed such that it changes its orientation, or the orientation of its TDM, upon excitation. For example, for organometallic complexes, the complex may be designed to have 2 ligands of slightly dis-similar energy. Where the chemical composition of the molecule forces the TDM of the higher energy ligand to align perpendicular to the plasmonic surface, and the TDM of the lower energy ligand parallel to the surface. The plasmon will excite the higher energy ligand preferentially but that energy will transfer to the low energy ligand which will limit back-coupling.

Figure 4:
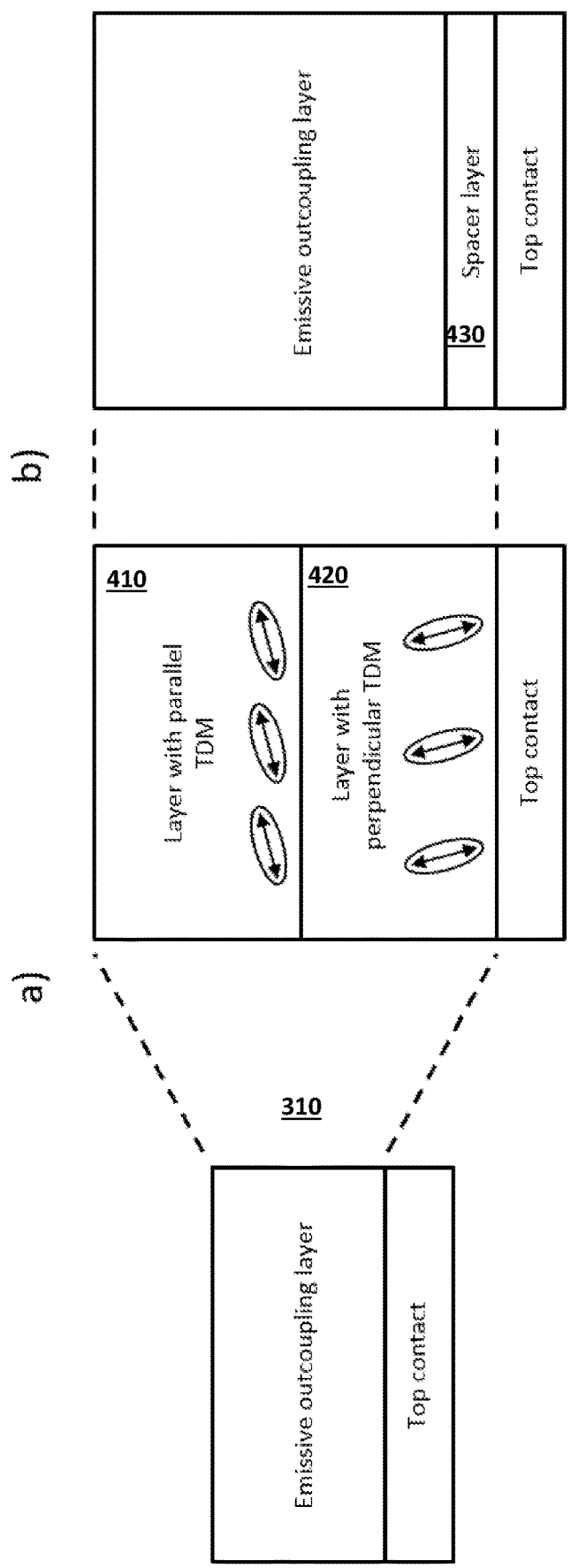
FIG. 4 shows example variants of an emissive outcoupling and an adjacent top electrode contact, including a multi-layer stack incorporating molecules of differing transition dipole moment orientations in each layer (configuration (a)), or a spacer layer to space the emitters in the emissive outcoupling layer a certain distance away from the contact (configuration (b)). Corresponding architectures are applicable to an emissive outcoupling layer adjacent a bottom contact.

FIG. 4 shows various schematic arrangements of an emissive outcoupling layer as disclosed herein. Generally, an emissive outcoupling layer 310 may be disposed above or otherwise near an enhancement layer, which may include an electrode contact, as previously disclosed. The examples shown in FIG. 4 are provided with respect to a top electrode contact, but corresponding arrangements including identical emissive outcoupling layer structures may be used for any emissive outcoupling layer as disclosed herein.

In structure (a), the device architecture also may be used to reduce back-coupling. In an embodiment, the emissive material in one or more emissive outcoupling layers 410, 420 may include one or more triplet-emitting emissive materials having non-parallel transition dipole moments (TDMs) for an absorptive singlet state and an emissive triplet state. The angle between the TDMs of the absorptive and emissive states may be 30-63 degrees. For example, two or more emitter molecules may be incorporated into two or more emissive outcoupling layers 410, 420, such that the molecule in the layer 420 closest to the electrode has a TDM aligned perpendicular to the electrode and one or more additional layers 410 (farther from the electrode) contain a molecule having a TDM aligned parallel to the contact. More generally, the angle between the singlet TDM and the electrode may be 30-63 degrees and/or the angle between the triplet TDM and the electrode may be 37-60 degrees, based upon the limit(s) at which the emissive TDM becomes more horizontally than vertically aligned, where the absorptive TDM is perfectly vertical. Such an arrangement may maximize outcoupling efficiency of the emissive TDM. Furthermore, the molecules may be designed to efficiently and quickly transfer energy from the emitter with perpendicular TDM to the emitter with parallel TDM, i.e., before quenching to the surface plasmon mode can occur. Such a configuration may move the energy farther away from the electrode contact, thereby reducing the chance of back-coupling into the surface plasmon mode. The final emission from the parallel TDM molecule also may reduce wave-guiding losses in the emissive outcoupling layer. In a variation of this architecture, the two emitter molecules with perpendicular TDMs may be mixed into the same layer via, for example, co-evaporation. In another variation, the emissive outcoupling layer emitter molecule may be doped into a host matrix wherein the host molecule has a (relatively) high index of refraction to cause a redshift of the absorption and emission spectra for the layer farther from the contact, and utilizing a lower-index host for the layer closer to the contact. In another variation, the emissive outcoupling layer emitter molecule may be doped into a host matrix wherein the host molecule can couple to the surface plasmon mode and transfer that energy to the emissive outcoupling layer emitter molecule. It may be preferred for the absorptive TDM of the host to be perpendicular to the contact to maximize coupling of this TDM to the plasmon mode, and the absorptive TDM of the emissive outcoupling layer emitter molecule to be parallel to the contact to minimize back-coupling of the emitter energy back into the surface plasmon mode of the contact. Various materials may be used for one or both of the emissive materials in these emissive outcoupling layers. For example, one or both may include a fluorophore having a lowest-energy singlet TDM that is non-parallel to one or more higher-energy singlet TDMs within the same fluorophore. Alternatively or in addition, a structure that provides a multi-emitter cascade may be used as the emissive material. Such a configuration uses a series of layers having different emitters or a single layer with graded concentrations of different emitters. The multiple emitters may include at least one having an excited state with a similar energy to the plasmon energy, disposed near the enhancement layer, and/or at least one emitter with a lower-energy excited state that is disposed farther from the enhancement layer. This cascade "pulls" excited states within the emissive outcoupling layer far away from the plasmon enhancement layer so as to reduce or prevent back energy transfer into the enhancement layer, which would reduce the efficiency and effectiveness of the device. Such a structure promotes energy transfer from the first higher-energy emitter to the second lower-energy emitter, thereby drawing excitons away from the enhancement layer.

More generally, embodiments disclosed herein are designed such that the absorptive excited state is at a higher energy level than the emissive excited state. The absorptive excited state accepts plasmon energy transfer, while the emissive excited state acts to outcouple light efficiently. One way to achieve this effect is using an S1 state to absorb energy and a Ti state to emit, as previously disclosed. However, other arrangements may be used to achieve the same effect. As another example, an emitter with orthogonal singlet states may be used. In this case, the emitter may have an absorptive S2 or other singlet state Sn as well as an emissive S1 state. The energy then internally converts from the S2/Sn state to the S1 state, thereby achieving an equivalent energy transfer.

As another example, device architecture (b) shows an arrangement in which the emissive outcoupling layer is spaced away from the plasmonically active enhancement layer, which may, for example, be used to locate the emissive outcoupling layer in the ideal position where the tradeoff between plasmon pumping strength and back-coupling loss is optimized. A spacer layer 430 may be disposed between the enhancement layer and the emissive outcoupling layer to achieve the desired spacing. The spacer layer may be formed from any suitable material, such as a dielectric, and may be selected to have little or no optical effect on the operation of the emissive stack or the device as a whole. A spacer layer may be disposed anywhere in the device where additional distance is needed between otherwise adjacent layers, including between a bottom electrode or enhancement layer and an emissive outcoupling layer in a device as shown in FIG. 3A; between an upper electrode or enhancement layer and an emissive outcoupling layer in a device as shown in FIG. 3B, or both for devices as shown in FIG. 3C. Similarly, one or more spacer layers may be used throughout the device to achieve desired spacing of the various layers as disclosed herein, such as to achieve a desired "threshold distance" between the emissive layer and one or more enhancement layers.

In specific example arrangements, the emissive outcoupling layer may be disposed at least 1 nm, within about 10-20 nm, 1-20 nm, 1-10 nm, not more than 50 nm, not more than 100 nm, or any intervening distance, from the closest enhancement layer or electrode.

In an embodiment, the emissive outcoupling layer, or the entire device stack, may be corrugated to enable outcoupling of waveguide modes in the emissive outcoupling layer, as well as direct scattering of the surface plasmon mode energy in the contact(s). Examples of corrugated structures are described in further detail in U.S. application Ser. No. 16/685,161, filed Nov. 15, 2019, the disclosure of which is incorporated by reference in its entirety.

In addition to using the emitter in the emissive outcoupling layer as a method of converting energy stored in the plasmon mode to light, it also may be used for down-converting energy that is outcoupled from the plasmonic mode. For example, a display may be made from a blue plasmonic OLED device where the red and green sub-pixels are rendered by down-converting the blue light outcoupled from the plasmonic mode to red and green light, respectively. These approaches are orthogonal, so that a blue emitter in an emissive outcoupling layer may be used to outcouple light from the plasmonic mode, while then adding an additional emitter in the emissive outcoupling layer that down-converts the blue emitted light to a lower energy photon. Alternatively or in addition, the outcoupling of light may occur via corrugation or scattering from a periodic, quasi-periodic, or random set of structures that are on the order of the wavelength of light. In addition, the device may have a color filter to further modify the color of emission.

The device may also include a layer that modifies the radiation pattern, such as a diffuser or the like.

Various materials may be used to fabricate the layers and devices disclosed herein. For example, enhancement layers and electrodes may include one or more of Au, Ag, Mg, Al, Ir, Pt, Ni, Cu, W, Ta, Fe, Cr, Ga, Rh, Ti, Cr, Ru, Pd, In, Bi, a small organic molecule, a polymer, SiO2, TiO2, Al2O3, an insulating nitride, Si, Ge, and stacks or alloys of these materials.

Embodiments disclosed herein may be used in various electronic devices such as OLED displays and similar devices. In an embodiment, an OLED display may include multiple, individually-addressable OLED pixels, each of which has a structure as previously disclosed with respect to FIGS. 3-4. For example, each pixel may include an emissive stack disposed between two electrodes and an emissive outcoupling layer arranged in any of the configurations previously disclosed. In some cases, the emissive stack in each pixel may include the same emissive materials in one or more emissive layers. The emissive outcoupling layers in each pixel may include the same emissive materials or different emissive materials. As a specific example, blue pixels in the display may have the same emissive materials in the emissive stack as green and/or red pixels in the display, but different emissive materials in the emissive outcoupling layer(s). In some embodiments the color emitted by each pixel may be determined by the emissive material in the emissive outcoupling layer of each pixel. Continuing the previous example, the blue and green/red pixels may include emissive stacks that initially generate energy from the same emissive material(s) in the stacks. This energy may be coupled to one or more enhancement layers and/or electrodes and then to the different emissive outcoupling layers as previously disclosed, where it is emitted as light of a color determined by the particular emissive material or materials in each pixel. Each emissive stack may include one or more emissive layers, and each emissive outcoupling layer may include one or more emissive materials.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic emissive device comprising:
a substrate;
a first electrode disposed over the substrate;
an emissive stack disposed over the first electrode, the emissive stack comprising a first organic emissive material;
a second electrode disposed over the emissive stack;
a first enhancement layer comprising a plasmonic material exhibiting surface plasmon resonance that non-radiatively couples to the first organic emissive material in the emissive stack and transfers excited state energy from the organic emissive material to a non-radiative mode of surface plasmon polaritons of the enhancement layer; and
an emissive outcoupling layer disposed over the substrate and comprising a second emissive material;
wherein the device is configured to transfer energy from the non-radiative mode of surface plasmon polaritons of the enhancement layer to the second emissive material.

2. The device of claim 1, wherein the first enhancement layer comprises the first electrode or the second electrode.

3. The device of claim 2, wherein the first enhancement layer comprises an adhesion layer.

4. The device of claim 1, further comprising a second enhancement layer.

5. The device of claim 4, wherein the second enhancement layer comprises the second electrode.

6. The device of claim 1, wherein each of the first electrode, the second electrode, or each of the first electrode and the second electrode comprises a material independently selected from the group consisting of: Au, Ag, Mg, Al, Ir, Pt, Ni, Cu, W, Ta, Fe, Cr, Ga, Rh, Ti, Cr, Ru, Pd, In, Bi, a small organic molecule, a polymer, $SiO_2$, $TiO_2$, $Al_2O_3$, an insulating nitride, Si, Ge, and stacks or alloys of these materials.

7. The device of claim 1, wherein the second emissive material comprises a material selected from the group consisting of: a quantum dot, perovskite nanocrystals, a metal-organic framework, a covalent-organic framework, a thermally activated delayed fluorescence (TADF) emitter, a fluorescent emitter, and a phosphorescent organic emitter.

8. The device of claim 1, wherein the second emissive material comprises a material having a Stokes shift of not more than 20 nm.

9. The device of claim 1, wherein the second emissive material comprises a down-converting material that converts a high-energy excitation state to a lower-energy wavelength emission.

10. The device of claim 1, wherein the second emissive material comprises a molecule that changes the orientation of one or more transition dipole moments (TDMs) upon excitation of the molecule.

11. The device of claim 10, wherein the concentration of the second emissive material varies within the emissive outcoupling layer.

12. The device of claim 11, wherein the concentration is graded in proportion to a distance from an interface of the emissive outcoupling layer.

13. The device of claim 1, further comprising a second emissive outcoupling layer adjacent to the first emissive outcoupling layer, the second emissive outcoupling layer comprising a third emissive material.

14. The device of claim 1, wherein the second emissive material comprises a triplet-emitting emissive material having non-parallel transition dipole moments (TDMs) for an absorptive singlet state and an emissive triplet state.

15. The device of claim 14, wherein the second emissive material is arranged so that the singlet TDM is non-parallel to the second electrode.

16. The device of claim 1, wherein the second emissive material comprises a fluorophore having a lowest-energy singlet TDM that is non-parallel to one or more higher-energy singlet TDMs within the same fluorophore.

17. The device of claim 1, wherein the first emissive outcoupling layer is disposed between the first electrode and the substrate.

* * * * *